United States Patent
Hernandez et al.

(10) Patent No.: US 6,537,370 B1
(45) Date of Patent: Mar. 25, 2003

(54) PROCESS FOR OBTAINING A LAYER OF SINGLE-CRYSTAL GERMANIUM ON A SUBSTRATE OF SINGLE-CRYSTAL SILICON, AND PRODUCTS OBTAINED

(75) Inventors: Caroline Hernandez, Grenoble (FR); Yves Campidelli, Grenoble (FR); Daniel Bensahel, Grenoble (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/786,996
(22) PCT Filed: Sep. 10, 1999
(86) PCT No.: PCT/FR99/02154
§ 371 (c)(1), (2), (4) Date: Mar. 9, 2001
(87) PCT Pub. No.: WO00/15885
PCT Pub. Date: Mar. 23, 2000

(30) Foreign Application Priority Data

Sep. 10, 1998 (FR) .............................. 98 11313

(51) Int. Cl.$^7$ .............................................. C30B 25/04
(52) U.S. Cl. ............................ 117/88; 117/89; 117/97; 117/102; 117/105
(58) Field of Search .............. 117/88, 89, 97, 117/102, 105

(56) References Cited

U.S. PATENT DOCUMENTS

| 5,259,918 A | 11/1993 | Akbar et al. |
| 5,281,299 A | 1/1994 | Escoffier et al. |
| 5,878,970 A | * 3/1999 | Leeb ......................... 241/294 |
| 6,180,480 B1 | * 1/2001 | Economikos et al. ....... 438/386 |

FOREIGN PATENT DOCUMENTS

| EP | 0 518 800 A2 | 12/1992 |
| EP | 0 524 114 A1 | 1/1993 |

OTHER PUBLICATIONS

International Search Report.
"Initial growth characteristics of germanium on silicon in LPCVD using germane gas"; Kobayashi et al.; Journal of Crystal Growth 174; copyright 1997; published by Elsevier Science B.V.; pp. 686–690.
"Growth of Ge$_x$Si$_{1-x}$ Layers by Rapid Thermal Processing Chemical Vapor Deposition"; Jung et al.; 1046b Extended Abstracts; Spring Meeting, Los Angeles, CA, May 7–12, 1989 89/1 (1989), Princetor N.J.; pp. 216–217.
"Kinetics of silicon–germanium deposition by atmospheric–pressure chemical vapor deposition"; T.I. Kamins, D.J. Meyer; Appl. Phys. Lett. vol. 59, No. 2, Jul. 8, 1991; copyright 1991 American Institute of Physics; pp. 178–180.
"Line, point and surface defect morphology of graded, relaxed GeSi alloys on Si substrates"; E.A. Fitzgerald, S.B. Samavedam; Department of Materials Science and Engineering, MIT, Cambridge, Ma.; Thin Solid Films 294; copyright 1997 Elsevier Science S.A.; pp. 3–10.

* cited by examiner

Primary Examiner—Felisa Hiteshew
(74) Attorney, Agent, or Firm—Meyertons, Hood, Kivlin, Kowert & Goetzel, P.C.; Eric B. Meyertons

(57) ABSTRACT

The invention concerns a method which consists in: (a) stabilization of the monocrystalline silicon substrate temperature at a first predetermined temperature $T_1$ of 400 to 500° C.; (b) chemical vapour deposition (CVD) of germanium at said first predetermined temperature $T_1$ until a base germanium layer is formed on the substrate, with a predetermined thickness less than the desired final thickness; (c) increasing the CVD temperature from said first predetermined temperature $T_1$ up to a second predetermined temperature $T_2$ of 750 to 850° C.; and (d) carrying on with CVD of germanium at said second predetermined temperature $T_2$ until the desired final thickness for the monocrystalline germanium final layer is obtained. The invention is useful for making semiconductor devices.

38 Claims, 3 Drawing Sheets

PROCESS FOR OBTAINING A LAYER OF SINGLE-CRYSTAL GERMANIUM ON A SUBSTRATE OF SINGLE-CRYSTAL SILICON, AND PRODUCTS OBTAINED

This application is a 371 of PCT/FR99/02154 Sep. 10, 1999.

BACKGROUND OF THE INVENTION

1. Field of the Invention

The present invention relates in a general way to a process for obtaining a layer of single-crystal germanium on a substrate of single-crystal silicon.

2. Description of the Relevant Art

Silicon (Si) is the basic compound of microelectronics. It is currently available on the market in the form of wafers 200 mm in diameter. The performance limits of integrated circuits are in fact therefore those associated with the intrinsic properties of silicon. Among these properties, mention may be made of the electron mobility.

Germanium (Ge), which belongs to column IV of the Periodic Table of Elements, is a semiconductor. It is potentially more beneficial than Si since (i) it has a higher electron mobility, (ii) it absorbs well in the infrared range and (iii) its lattice parameter is greater than that of Si, thereby allowing heteroepitaxial structures using the semiconductor materials of columns III–V of the Periodic Table.

Unfortunately, germanium does not have a stable oxide and there are no large-diameter germanium wafers on the market, except at prohibitive prices.

$Si_{1-x}Ge_x$ alloys have already been grown on substrates of single-crystal Si. The alloys obtained only rarely have germanium contents exceeding 50% in the alloy.

Moreover, when SiGe alloys are grown on single-crystal Si, the growth of the SiGe alloy is initially single-crystal growth. The greater the thickness of the layer and the higher its germanium content, the more the layer becomes "strained". Above a certain thickness, the "strain" becomes too high and the layer relaxes, emitting dislocations. These dislocations have a deleterious effect on the future circuits which will be constructed on this layer and the relaxation of the layers causes certain advantages of the strained band structure (offsetting of the conduction and valence bands depending on the strain states; Si/SiGe or SiGe/Si) to be lost. Corresponding to each composition and to each production temperature there is therefore a maximum thickness of strained layer.

In some applications, the concept of "relaxed substrates" has been developed, that is to say $Si_{1-x}Ge_x$ layers are grown on silicon so as to exceed the critical thickness for a given composition, but by adjusting the deposition parameters for the layers so that the dislocations emitted do not propagate vertically but are bent over as to propagate in the plane of the layer in order subsequently to evaporate at the edges of the wafer. Growth therefore takes place from layers increasingly rich in germanium, it being possible for the germanium gradient to change stepwise or in a continuous fashion.

However, the films obtained by this "relaxed substrate" process either have a relatively low (<50%) degree of germanium enrichment or have an unacceptable emergent-dislocation density for applications in microelectronics.

Thus, the article entitled "Stepwise equilibrated graded $Ge_xSi_{1-x}$ buffer with very low threading dislocation density on Si (001)", by G. Kissinger, T. Morgenstern, G. Morgenstern and H. Richter, Appl. Phy. Lett. 66(16), Apr. 13, 1995, describes a process in which the sequence of the following layers is deposited on a substrate:

250 nm $Ge_{0.05}Si_{0.95}$+100 nm $Ge_{0.1}Si_{0.9}$+100 nm $Ge_{0.15}Si_{0.85}$+150 nm $Ge_{0.2}Si_{0.8}$.

After deposition, each layer undergoes in situ annealing in hydrogen at 1095° C. or 1050° C. By way of comparison, similar sequences of layers have been deposited, but without annealing.

A 300 nm layer of $Ge_xSi_{1-x}$ of the same composition as the upper buffer layer is also deposited on the latter.

The specimens that did not undergo intermediate annealing have an emergent-dislocation density of $10^6$ cm$^{-2}$, whereas the specimen that did undergo annealing has an emergent-dislocation density of $10^3$–$10^4$ cm$^{-2}$.

The article entitled "Line, point and surface defect morphology of graded, relaxed GeSi alloys on Si substrates", by E. A. Fitzgerald and S. B. Samavedam, Thin Solid Films, 294, 1997, 3–10, describes the fabrication of relaxed substrates comprising up to 100% germanium. However, the process employed takes a long time (more than about 4 hours per wafer) and is consequently unattractive from an industrial standpoint. Moreover, this process is not reversible, that is to say it does not allow pure silicon to be deposited on a germanium substrate.

Furthermore, during the fabrication of such relaxed substrates, a surface roughness is observed which increases depending on the deposition conditions and which may have negative effects—since they are cumulative—that is to say the onset of roughness can only become greater as the deposition proceeds.

A deposition process has also been proposed which makes it possible to form, on a silicon substrate, $Si_{1-x}Ge_x$ layers (x varying from 0 to 1), possibly going as far as a layer of pure Ge, and having a low emergent-dislocation density.

The essential characteristic of this process includes, during the chemical vapor deposition, continuously modifying the stream of active gases ($SiH_4$ and $GeH_4$, for example) at the same time as the deposition temperature is varied. Thus, the emitted dislocations are rapidly rejected and removed in order to gradually relax the growing layer. Thus, it is possible to obtain these relaxed substrates going from a Ge concentration of zero (Si substrate) to a Ge concentration of 100% with a 4 to 5 µm film whereas the prior techniques require interlayers of more than 10 µm (typically about 25 µm).

The advantages of the latter technique are therefore a smaller thickness of interlayer, so as to obtain a relaxed-substrate surface layer, and a low defect (emergent dislocation) density of about $10^5$ defects/cm$^2$ (compared with $10^6$ for the prior processes).

However, this process still requires the deposition of an interlayer having a Ge concentration gradient, which requires film thicknesses of about 4 to 5 µm.

Moreover, this technique also requires long deposition times, of more than one hour per wafer treated in certain cases, thereby reducing the hourly output of wafers and increasing the fabrication cost of the wafers.

SUMMARY OF THE INVENTION

Disclosed herein is a novel process for depositing a layer of pure single-crystal germanium on a substrate of single-crystal silicon, which does not require the deposition of an interlayer with a concentration gradient.

Disclosed herein is also such a deposition process giving low densities of residual emergent dislocations, of less than $10^3$ defects/cm$^2$ of surface.

Additionally such a process allows a layer to be obtained in a very short time and with small thickness (about 10 minutes for a 1 μm layer of pure Ge).

According to a first method, the process for forming a layer of pure single-crystal germanium on a substrate of single-crystal silicon includes:

(a) temperature stabilization of the single-crystal silicon substrate at a first predetermined stabilized temperature ($T_1$) of 400° C. to 500° C., preferably of 430° C. to 460° C.;

(b) chemical vapor deposition (CVD) of germanium at said first predetermined temperature ($T^1$) until a germanium base layer with a predetermined thickness of less than a desired final thickness obtained on the substrate;

(c) increase in the germanium chemical vapor deposition temperature from the first predetermined temperature ($T_1$) to a second predetermined temperature ($T_2$) ranging from 750° C. to 850° C., preferably from 800° C. to 850° C.; and (d) continuation of the germanium chemical vapor deposition at said second predetermined temperature ($T_2$) until the desired final thickness of the single-crystal germanium layer is obtained.

According to a second method, the process for forming a layer of pure single-crystal germanium on a substrate of single-crystal silicon comprise, after step (c) and before step (d):

($c_1$) a step in which the germanium CVD deposition is stopped and the temperature is lowered from the second predetermined temperature ($T_2$) down to a third predetermined temperature ($T_3$) of 500 to 600° C., preferably of 540 to 560° C.:

($c_2$) a step of chemical vapor deposition at the third predetermined temperature ($T_3$) of an $Si_{1-x}Ge_x$ alloy, where $x \leq 0.9$, until an $Si_{1-x}Ge_x$ alloy interlayer having a predetermined thickness is obtained;

($c_3$) a transition step in which, at the third predetermined temperature ($T_3$), the chemical vapor deposition of the $Si_{1-x}Ge_x$ alloy changes over to chemical vapor deposition of pure Ge;

($c_4$) a step in which the CVD deposition of germanium is continued at said third predetermined temperature ($T_3$) so as to obtain a multiplayer stack comprising the germanium base layer, and $Si_{1-x}Ge_x$ alloy interlayer and a germanium top layer, the thickness of the stack being less than the desired final thickness; and ($c_5$) a step in which the germanium chemical vapor deposition temperature is increased from the third predetermined temperature ($T_3$) up to a fourth predetermined temperature ($T_4$) of 750 to 850° C., preferably 800 to 850° C.;

step (d) being carried out at this fourth predetermined temperature (T4), which is identical to or different from second predetermined temperature ($T_2$), but preferably identical.

For chemical vapor deposition of pure germanium, any germanium precursor gas such as $GeH_4$ may be used. As is well known, the germanium precursor gas is diluted with a carrier gas such as hydrogen. The dilution factors may vary from 10 to 1000. Preferably, the $GeH_4/H_2$ volume ratio is 10%.

Germanium deposition is preferably carried out at atmospheric pressure, since when the total pressure is less than 500 hPa the films deposited very quickly become rough and the emergent-dislocation density increases.

Step (a) of stabilizing the temperature of the silicon substrate is carried out in the absence of any reactive gas, but with the carrier gas, generally $H_2$, present.

In all the chemical vapor deposition steps it is preferred to use, as carrier gas, $H_2$ (purified or not) with a flow rate of about 20 l/minute.

In the pure germanium deposition steps, the precursor gas is preferably $GeH_4$ and the flow rate is generally between 30 and 400 cm³/minute under standard conditions, the optimum value being 300 cm³/minute (of course, these are values of the nominal flow rate of $GeH_4$ diluted to 10% by volume in $H_2$).

The durations of the germanium CVD deposition steps are, of course, determined according to the desired thickness of the final germanium layer.

Thus, in the first method, under the above preferred conditions and with a duration of 10 minutes for step (b), of 60 seconds for step (c) and of 120 seconds for step (d), a final layer of about 1 μm of pure single-crystal germanium having an extremely low emergent-dislocation density, possibly of less than 10 defects/cm², is obtained.

In the case of the second method, all the steps are also carried out in the presence of a carrier gas, preferably hydrogen, and also preferably at atmospheric pressure.

Step ($c_1$) of lowering the temperature is carried in the absence of reactive precursor gases but in the presence of carrier gas, for example hydrogen.

Apart from the deposition temperatures, germanium CVD deposition is carried out under the same conditions as above.

The CVD deposition of the $Si_{1-x}Ge_x$ alloy layer is carried out using a mixture of germanium precursor and silicon precursor gases in the desired proportions for obtaining a film of $Si_{1-x}Ge_x$ alloy containing at least 90 wt. % germanium. The recommended germanium precursor gas is $GeH_4$. The recommended silicon precursor gases are $SiH_4$, $Si_2H_6$, $SiH_2Cl_2$, $SiHCl_3$, $SiCl_4$ and $Si(CH_3)_4$, $SiH_4$ being preferred.

The SiGe alloy interlayer will generally have a thickness of between 5 and 10 nm, preferably about 10 nm, and of course the CVD conditions for depositing this layer will be chosen so as to meet the requirements in terms of thickness and germanium content of the layer. In particular, if the germanium content of this SiGe alloy interlayer is less than 90 wt%, the emergent-dislocation density increases.

The process may include, prior to step (a) of stabilizing the temperature of the substrate, a step of impregnating the surface of the substrate by CVD vapor phase deposition of a silicon layer at a temperature of 500 to 600° C., preferably 550° C. This CVD deposition step is also preferably carried out at atmospheric pressure. The preferred precursor gas is $SiH_4$ and, as is well known, the deposition is carried out in the presence of a carrier gas, preferably hydrogen.

The thickness of the silicon impregnation layer is generally from 1 to 5 nm, preferably about 3 nm.

Although this is not very well understood, the presence of such an impregnation layer reduces the emergent-dislocation density in the final product.

Also preferably, the surface of the substrate is subjected to a preparation step prior to implementing the process.

This preparation step may conventionally be a surface cleaning step, for example any process in a liquid or gas phase which cleans the silicon surface of metallic and organic residues, such as the conventional SC1 ($NH_4OH + H_2O_2$) and $SC_2$ ($HCl + H_2O_2$) solutions, or even $H_2SO_4 + H_2O_2$. In all cases, the cleaning is completed by a treatment phase using a dilute aqueous HF solution followed by rinsing with water.

The products obtained by the process generally have an emergent-dislocation density $\leq 10^3$/cm² and possibly even less than 10 defects/cm².

Although the process described above limits the appearance of surface roughness, it is still desirable to reduce the surface roughness of the germanium film.

To eliminate the roughness, it is possible to use any type of chemical-mechanical polishing conventionally used in silicon technology.

The principle of chemical-mechanical polishing is known and conventional and includes rubbing the wafer to be polished on a cloth imbibed with an abrasive, applying pressure and moving this wafer with respect to the cloth. The combined mechanical and chemical effects remove molecules of the polished material preferentially in the raised areas and planarizes the material to be polished.

The polishing is controlled either in situ, by controlling the polishing data such as the motor current, or ex situ qualitatively by optical or microscopical observation and/or quantitatively by using the technique of atomic force microscopy [measurement of the (rms) or peak/valley average roughness].

After polishing, mechanical residues (encrusted matter) may remain on the surface and these are removed by mechanical brushing and rinsing.

After this cleaning, the polishing may leave a disturbed area on the surface and a treatment to regenerate the surface may be necessary. This treatment, which is of the etching type, must nevertheless be carried out without causing the entire active layer to disappear. Several procedures are possible.

It is possible either (i) for the layer to undergo dry or wet etching or (ii) for the surface to be oxidized and then for the oxide to be dissolved. These two means use the extreme sensitivity of Ge to oxygen (oxygen gas or ozone or ozone dissolved in water, or oxygen plasma, etc), Ge oxides being volatile or unstable.

After these treatments, it is possible to resume epitaxy on the surface, particularly according to the process of the invention described above. In this preferred case, the desired surface finish (number of defects), and hence a "guaranteed" layer, is obtained immediately, it being possible for the thickness of the layer to be adjusted according to the application envisioned. In addition, the impurities are trapped by the subjacent dislocation network.

The processes described above therefore make it possible to obtain germanium layers of single-crystal structure directly deposited on silicon which are of very high quality and which allow further deposition by heteroepitaxy of elements of Groups III to V of the Periodic Table and of compounds of these elements (III–V heteroepitaxy) such as GaAs.

However, the Ge layers obtained may be under a slight strain (lattice parameter slightly less than that of bulk Ge) detrimental to subsequent growth of a heteroepilayer, for example of GaAs on Ge. The Ge layer could relax this strain during a subsequent temperature rise, but this would have the regrettable effect of making the surface rough again and therefore of impeding the subsequent III–V heteroepitaxial growth, for example by creating defects.

In order to avoid this latter effect, the particularly preferred processes include a step of stabilizing the germanium layer. This stabilization step, introduced at the end of growth of the germanium layer (before the chemical-mechanical polishing), has the effect (1) of relaxing the strains and recovering the theoretical lattice parameter of germanium and (2) of consequently stabilizing the structure during subsequent annealing treatments.

More specifically, this stabilization step consists of an annealing treatment in a hydrogen atmosphere at a temperature ranging from 650° C. to less than 900° C. for a sufficient time, generally about minutes or longer, in order to eliminate the residual strain. The duration of the annealing treatment obviously depends on the annealing temperature and on the thickness of the germanium layer.

It is preferable that the annealing temperature be below 900° C., since above 900° C. germanium, which melts at 937° C., becomes very unstable.

This stabilization step may be carried out in a conventional multiwafer furnace; however, it is preferably carried out in situ (after growing the germanium layer) so as to avoid any contaminations by carbon and oxygen species in a single-wafer reactor.

After annealing, the germanium layer may undergo a chemical-mechanical polishing treatment as described above.

After cleaning the wafers, for example using a bath of oxonated water, a bath of dilute HF and drying under IPA, a heteroepilayer, for example of Ge or GaAs, may be grown.

BRIEF DESCRIPTION OF THE DRAWINGS

The rest of the description refers to the appended figures which show, respectively.

DETAILED DESCRIPTION OF THE INVENTION

A preferred implementation of the first method will now be described with reference to FIG. 1.

A single-crystal silicon wafer (200 mm) is placed in a single-wafer industrial reactor.

Figure 1:
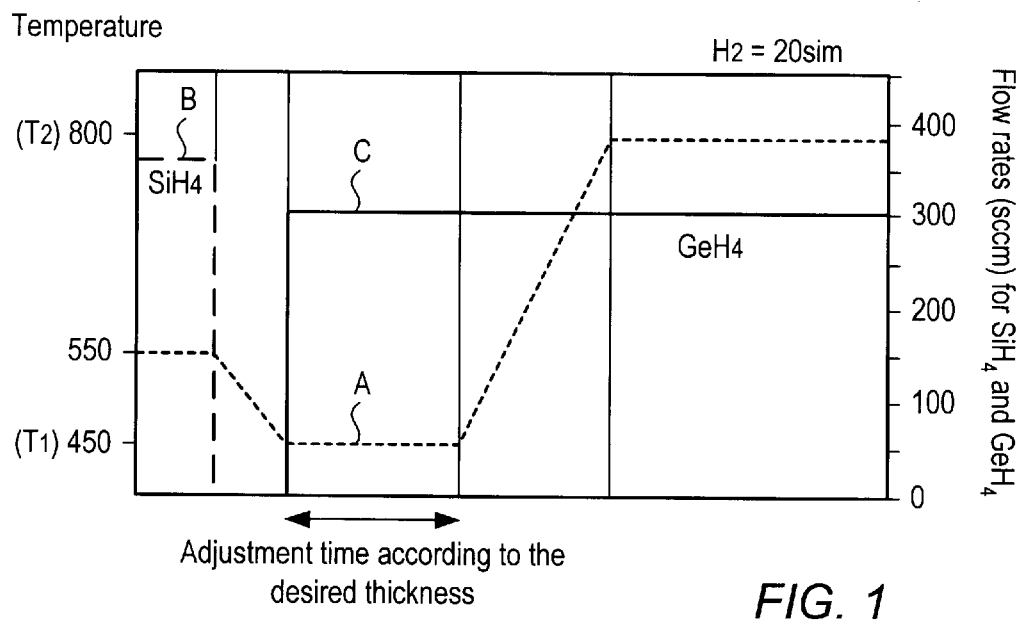
FIG. 1, a graph of the deposition temperatures as a function of time (curve A) and graphs of the flow rates of the $SiH_4$ and $GeH_4$ precursor gases as a function of time (curves B and C) for the first method of carrying out the process.

The surface of the wafer is impregnated with silicon by chemical vapor deposition under the following conditions, shown schematically in FIG. 1 by curve B and the corresponding part of curve A:

Total pressure: atmospheric pressure;
Deposition temperature: 550° C.;
$SiH_4$ precursor gas: 350 $cm^3$/minute;
$H_2$ carrier gas: 20 1/minute;
Deposition time: 30 seconds.
An approximately 3 nm thick silicon layer is deposited.
(a) The $SiH_4$ inflow is stopped and the temperature lowered so as to stabilized at 450° C.

(b) A single-crystal germanium layer is then deposited by CVD under the following conditions:

Total pressure: atmospheric pressure;
Deposition temperature ($T_1$): 450° C.;
$GeH_4$ precursor gas: 300 cm³/minute;
$H_2$ carrier gas: 20 l/minute;
Deposition time: 10 minutes.

A Ge layer having a thickness of slightly less than 1 μm is obtained.

(c) Germanium deposition is continued for 60 seconds while increasing the temperature from 450 to 850° C. and maintaining all the other deposition conditions.

(d) Finally, germanium deposition is maintained at 850° ($T_2$) for 120 seconds in order to obtain a layer of pure single-crystal germanium having a thickness of 1 μm.

Figure 3:
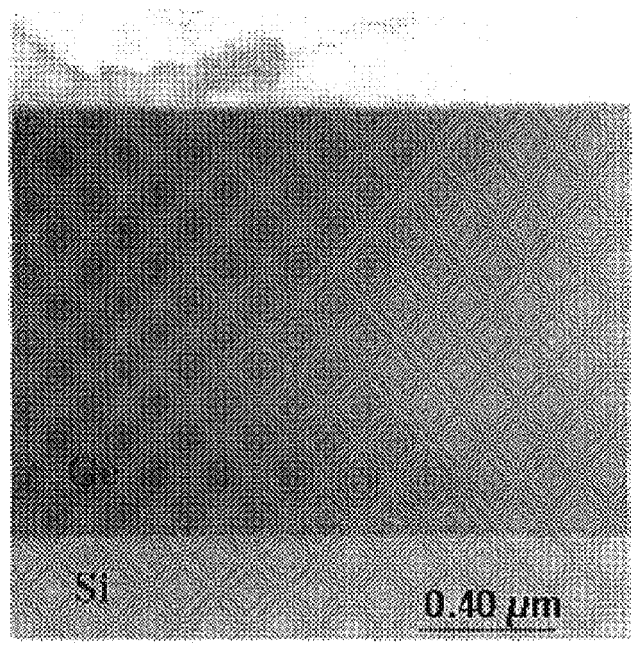
FIG. 3, a photomicrograph of a cross section of a single-crystal silicon substrate coated, according to the first method, with a film of pure single-crystal germanium (area observed in electron microscopy on the wafer) y.
Figure 4:
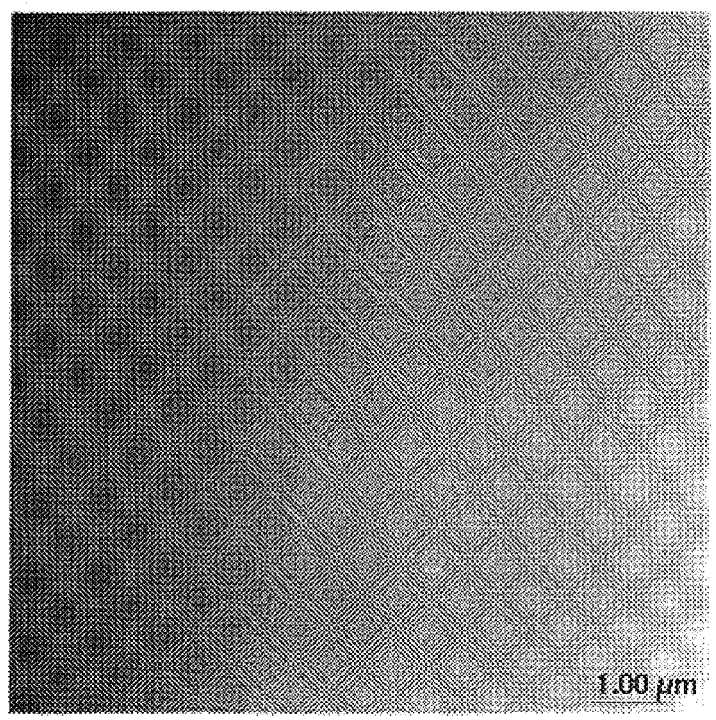
FIG. 4, a photomicrograph of a surface of a single-crystal silicon substrate coated, according to the first method, with a film of pure single-crystal germanium (area observed in electron microscopy in plan view)

FIG. 3 is a photomicrograph obtained in a scanning electron microscope, of a cross section of the film obtained and FIG. 4 is a plan view of the film. These views show the absence of emergent dislocations in the germanium film.

The same deposition process was repeated, but by varying the final deposition temperature ($T_2$), and the emergent-dislocation density was determined.

The results are given in Table I below.

TABLE I

| $T_2$ (final deposition Temperature) | Emergent-dislocation density (defects/cm² |
|---|---|
| 700° C. | 5 × 10⁵ |
| 750° C. | 5 × 10⁴ |
| 800° C. | 5 × 10³ |
| 830° C. | <10 |
| 850° C. | <10 |

Figure 2:
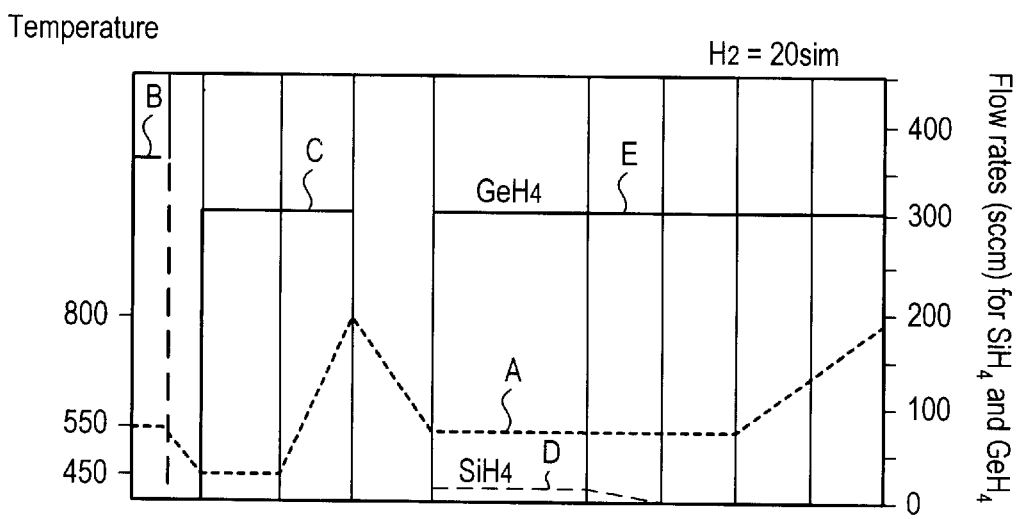
FIG. 2, graphs of the flow rates of the SiH4 precursor gas (curves B and D) and of the GeH4 precursor gas (curves C and E) as a function of time, and a graph of the deposition temperatures as a function of time (curve A)

A preferred implementation of the second method of carrying out the process will now be described with reference to FIG. 2.

The implementation of the process starts as previously by impregnating the surface of the wafer and carrying out steps (a), (b) and (c).

($c_1$) After step (c), the inflow of $GeH_4$ is stopped, while leaving the flow rate of $H_2$, and the temperature is lowered from 850° C. to 550° C. in about one minute.

($c_2$) An $Si_{0.1}Ge_{0.9}$ alloy layer is then deposited by CVD under the following conditions:

Total pressure: atmospheric pressure;
Deposition temperature: 550° C.;
$GeH_4$ flow rate: 300 cm³/minute;
$SiH_4$ flow rate: 10 cm³/minute;
$H_2$ flow rate: 20 l/minute;
Deposition time: 120 seconds.

An $Si_{0.1}Ge_{0.9}$ approximately 15 nm in thickness is obtained.

($c_3$) After deposition for 120 seconds, the inflow of $SiH_4$ is gradually stopped over 60 seconds.

($c_4$) Germanium then continues to be deposited at 550° C. ($GeH_4$ flow rate: 300 cm³) for 60 seconds, then ($c_5$) while still continuing to deposit germanium, the temperature is increased from 550° C. to 850° C. ($T_4$) over 120 seconds and (d) germanium continues to be deposited at the latter temperature in order to obtain the single-crystal germanium layer with the desired thickness of about 1 μm, including the SiGe alloy interlayer.

This process is repeated by varying the temperature ($T_2$) of step (b) and the final temperature ($T_4$) of step (d).

The dislocation densities for each pair of temperatures was measured. The results are given in Table II.

TABLE II

| $T_2$ | $T_4$ | Emergent-dislocation density (defects/cm² |
|---|---|---|
| 750° C. | 700° C. | 1.6 × 10³ |
| 750° C. | 850° C. | 2.5 × 10² |
| 850° C. | 850° C. | 1.6 × 10³ |
| 800° C. | 700° C. | 2 × 10⁴ |

The wafer coated with the polycrystalline germanium layer (I) obtained by the preferred implementation of the first method described above was subjected to the following steps:

cleaning of the wafer using a bath of ozonated water, a bath of dilute HF and drying under IPA;

annealing of the wafer in a single-wafer rig at a temperature of about 650° C. for 30 minutes (the temperature rise lasts about 1 minute); and epitaxy of a new germanium layer (II) on the annealed germanium layer (I) by chemical vapor deposition (CVD) under the following conditions:

precursor gas: $GeH_4$,
carrier gas: $H_2$,
pressure: 2666 Pa (20 torr),
temperature: about 760° C.

The epitaxially regrown germanium layer (II) has a thickness of 500 nm.

The epitaxial regrowth of the germanium layer (II) may also be carried out at atmospheric pressure and at a temperature above 670° C.

By way of comparison, a germanium layer (II) was epitaxially regrown under the same conditions on a wafer obtained in an identical manner but without the annealing step.

Figure 5:
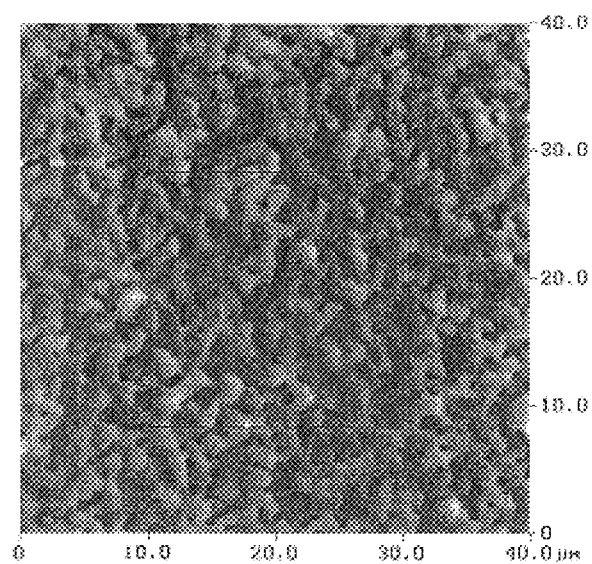
FIG. 5, an atomic force microscopy (AFM) profile of a Ge layer regrown epitaxially on a germanium layer obtained according to the process, but not stabilized.
Figure 6:
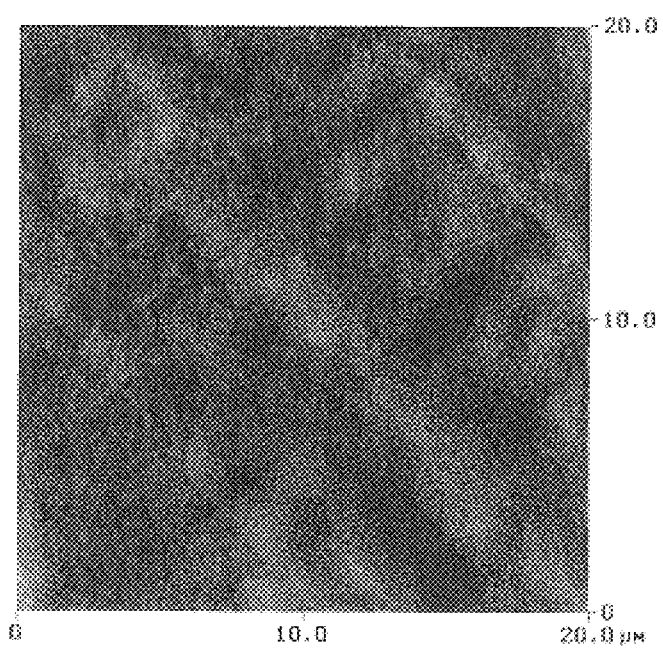
FIG. 6, an AFM profile of a Ge layer regrown epitaxially on a germanium layer obtained according to the process, but stabilized.

As shown in FIGS. 5 and 6, the germanium layer (II) epitaxially regrown on a germanium layer (I) that has undergone a stabilization annealing treatment (FIG. 6) had a markedly lower roughness (average roughness Ra=0.311 nm) compared with the germanium layer (II) epitaxially regrown on an unstabilized germanium layer (I) (FIG. 5) (average roughness Ra=1.412 nm).

What is claimed is:

1. Process for forming a layer of single-crystal germanium on a substrate of single-crystal silicon, comprising:
    (a) heating the single-crystal silicon substrate to a first temperature ($T_1$) of about 400 to 500° C.;
    (b) depositing germanium by chemical vapor deposition (CVD) at the first temperature ($T_1$) until a germanium base layer with a thickness of less than a final thickness is obtained on the substrate;
    (c) increasing the germanium CVD deposition temperature from the first temperature ($T_1$) to a second temperature ($T_2$) ranging from about 750° C. to 850° C.; and
    (d) depositing germanium by CVD deposition at the second temperature ($T_2$) until the final thickness of the single-crystal germanium layer is obtained.

2. Process according to claim 1 wherein the second predetermined temperature ($T_2$) is chosen within the 800 to 850° C. temperature range.

3. Process according to claim 1 wherein the first predetermined temperature ($T_1$) is chosen within the 430 to 460° C. temperature range.

4. Process according to claim 1, wherein the germanium CVD deposition uses $GeH_4$ as precursor gas.

5. Process according to claim 1 wherein all steps (a) to (d) are carried out in the presence of hydrogen.

6. Process according to claim 1 wherein all the steps are carried out at atmospheric pressure.

7. Process according to claim 1, further comprising, prior to step (a), depositing a silicon impregnation layer by CVD at a temperature of 500 to 600° C.

8. Process according to claim 7, wherein the silicon impregnation layer has a thickness of 1 to 5 nm.

9. Process according to claim 7 wherein the CVD deposition of the silicon impregnation layer is carried out at atmospheric pressure.

10. Process according to claim 1 further comprising chemical-mechanical polishing of the pure single-crystal germanium layer.

11. Process according to claim 1, wherein the process is carried in a single-wafer reactor.

12. Process according to claim 1 further comprising annealing of the germanium layer obtained in step (d).

13. Process according to claim 12, wherein annealing is carried out at a temperature of between 650° C. and less than 900° C.

14. Process according to claim 12 wherein annealing has a duration of at least 10 minutes.

15. Process according to claim 12, further comprising epitaxially regrowing an element from Groups III to V of the Periodic Table or of a compound of them.

16. Process according to claim 15, wherein the epitaxially regrown element or compound is Ge or GaAs.

17. Process according to claim 15, further comprising a step of chemical-mechanical polishing of the epitaxially regrown layer.

18. Process for forming a layer of single-crystal germanium on a substrate of single-crystal silicon, comprising:

(a) heating the single-crystal silicon substrate to a first temperature ($T_1$) of about 400 to 500° C.;

(b) depositing germanium by chemical vapor deposition (CVD) at the first temperature ($T_1$) until a germanium base layer with a thickness of less than a final thickness is obtained on the substrate;

(c) increasing the germanium CVD deposition temperature from the first temperature ($T_1$) up to a second temperature ($T_2$) of about 750° C. to 850° C.;

($c_1$) depositing germanium by CVD deposition and lowering the temperature from the second temperature ($T_2$) down to a third temperature ($T_3$) of about 500 to 600° C.;

($c_2$) depositing by CVD deposition, at the third temperature ($T_3$), a alloy where x≦0.9 until an $Si_{1-x}Ge_x$ alloy interlayer; the thickness of the $Si_{1-x}Ge_x$ alloy interlayer being less than the final thickness;

($c_3$) altering the deposition, at the third temperature ($T_3$), from CVD deposition of the $Si_{1-x}Ge_x$ alloy to CVD deposition of pure germanium;

($c_4$) continuing CVD deposition of pure germanium at the temperature ($T_3$) so as to obtain a multilayer stack comprising the germanium base layer, the $Si_{1-x}Ge_x$ alloy interlayer and a germanium top layer, the thickness of the stack being less than the final thickness;

($c_5$) increasing the germanium CVD deposition temperature from the third temperature ($T_3$) up to a fourth temperature ($T_4$) of about 750° C. to 850° C.; and (d) continuing germanium CVD deposition at the fourth temperature ($T_4$) until the final thickness of the single-crystal germanium layer is obtained.

19. Process according to claim 18, wherein the third temperature ($T_3$) is chosen within the 540 to 560° C. temperature range.

20. Process according to claim 18, wherein the fourth temperature ($T_4$) is chosen within the 800 to 850° C. temperature range.

21. Process according to claim 18 wherein the $Si_{1-x}Ge_x$ alloy interlayer (x≧0.9) has a thickness of between 5 and 10 nm.

22. Process according to claim 18 wherein the CVD deposition of the $Si_{1-x}Ge_x$ alloy is carried out using a mixture of precursor gases comprising $GeH_4$ and $SiH_4$.

23. Process according to claim 18, wherein the second temperature ($T_2$) is chosen within the 800 to 850° C. temperature range.

24. Process according to claim 18, wherein the first predetermined temperature ($T_1$) is chosen within the 430 to 460° temperature range.

25. Process according to claim 18 wherein the germanium CVD deposition uses GeH4 as precursor gas.

26. Process according to claim 18 wherein all steps (a) to (d) are carried out in the presence of hydrogen.

27. Process according to claim 18 wherein all the steps are carried out at atmospheric pressure.

28. Process according to claim 18, further comprising, prior to step (a), depositing a silicon impregnation layer by CVD at a temperature of 500 to 600° C.

29. Process according to claim 28, wherein the silicon impregnation layer has a thickness of 1 to 5 nm.

30. Process according to claim 28 wherein the CVD deposition of the silicon impregnation layer is carried out at atmospheric pressure.

31. Process according to claim 18 further comprising chemical-mechanical polishing of the pure single-crystal germanium layer.

32. Process according to claim 18, wherein the process is carried in a single-wafer reactor.

33. Process according to claim 18, further comprising annealing of the germanium layer obtained in step (d).

34. Process according to claim 33, wherein annealing is carried out at a temperature of between 650° C. and less than 900° C.

35. Process according to claim 33 wherein annealing has a duration of at least 10 minutes.

36. Process according to claim 33, further comprising epitaxially regrowing an element from Groups III to V of the Periodic Table or of a compound of them.

37. Process according to claim 36, wherein the epitaxially regrown element or compound is Ge or GaAs.

38. Process according to claim 36, further comprising a step of chemical-mechanical polishing of the epitaxially regrown layer.

* * * * *

UNITED STATES PATENT AND TRADEMARK OFFICE
CERTIFICATE OF CORRECTION

| | | |
|---|---|---|
| PATENT NO. | : 6,537,370 B1 | Page 1 of 1 |
| DATED | : March 25, 2003 | |
| INVENTOR(S) | : Hernandez et al. | |

It is certified that error appears in the above-identified patent and that said Letters Patent is hereby corrected as shown below:

<u>Column 9,</u>
Line 49, please delete "where $x \leq 0.9$" and substitute therefor -- "where $x \geq 0.9$" --.

Signed and Sealed this

Sixteenth Day of September, 2003

JAMES E. ROGAN
*Director of the United States Patent and Trademark Office*